(12) United States Patent
Jun et al.

(10) Patent No.: US 7,151,279 B2
(45) Date of Patent: Dec. 19, 2006

(54) THIN FILM TRANSISTOR ARRAY PANEL AND MANUFACTURING METHOD THEREOF

(75) Inventors: Sahng-Ik Jun, Seoul (KR); Jae-Hong Jeon, Seongnam-si (KR); Kwon-Young Choi, Goyang-si (KR); Jeong-Young Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 10/954,524

(22) Filed: Sep. 29, 2004

(65) Prior Publication Data

US 2005/0104069 A1 May 19, 2005

(30) Foreign Application Priority Data

Oct. 13, 2003 (KR) ...................... 10-2003-0071092

(51) Int. Cl.
*H01L 29/04* (2006.01)

(52) U.S. Cl. ............................ 257/72; 257/59; 257/88; 257/91; 257/93; 257/E21.703; 257/E27.111; 257/E29.117; 438/149; 438/157

(58) Field of Classification Search .................... None
See application file for complete search history.

(56) References Cited

U.S. PATENT DOCUMENTS

| 5,777,703 | A | * | 7/1998 | Nishikawa | .................... 349/47 |
| 2005/0112790 | A1 | * | 5/2005 | Lan et al. | ..................... 438/30 |

* cited by examiner

*Primary Examiner*—Nathan J. Flynn
*Assistant Examiner*—Scott R. Wilson
(74) *Attorney, Agent, or Firm*—MacPherson Kwok Chen & Heid LLP

(57) ABSTRACT

A thin film transistor array panel is provided, which includes: a substrate; a first signal line formed on the substrate; a second signal line formed on the substrate and intersecting the first signal line; a thin film transistor including a gate electrode connected to the first signal line and having an edge substantially parallel to the first signal line, a source electrode connected to the second signal line, and a drain electrode overlapping the edge of the gate electrode; and a pixel electrode connected to the drain electrode.

15 Claims, 17 Drawing Sheets

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a manufacturing method thereof, and in particular, to a thin film transistor array panel for a display device and a manufacturing method thereof.

(b) Description of the Related Art

Generally, a liquid crystal display (LCD) includes a thin film transistor (TFT) array panel including signal lines, pixel electrodes, and TFTs, a common electrode panel including a common electrode facing the pixel electrodes, and a liquid crystal layer disposed between the panels.

The pixel electrodes are driven by signals from the signal lines including gate lines and data lines that intersect each other to define pixel areas. The signal lines are connected to the pixel electrodes through switching elements such as thin film transistors (TFTs).

Each of the TFTs has a gate electrode connected to a gate line, a source electrode connected to a data line, and a drain electrode connected to a pixel electrode. The TFT is turned on in response to a gate-on voltage supplied from the gate line through the gate electrode and receives data voltages from the data line through the source electrode. The TFT then transmits the data voltage to the pixel electrode through the drain electrode to charge the pixel electrode.

When the TFT is turned off by a gate-off voltage supplied from the gate line, the voltage of the pixel electrode is abruptly dropped due to a kickback voltage. The kickback voltage has a magnitude depending on a parasitic capacitance between the gate electrode and the drain electrode of the TFT. The kickback voltage generates flickering on the images displayed by the LCD, and the flickering may be reduced by adjusting a voltage applied to the common electrode.

In the meantime, the signal lines, the pixel electrodes, the TFTs, etc. are usually formed by photolithography including light exposure.

When an active area on a backplane for the TFT panels is too large to use a pattern mask, the entire exposure is accomplished by repeating a divisional exposure called step-and-repeat process. One divisional exposure unit or area is called a shot. Since transition, rotation, distortion, and etc. are generated during light exposure, the shots are not aligned accurately. Accordingly, the parasitic capacitances between the gate electrodes and the drain electrodes differ depending on the shots, and this causes the difference in the kickback voltages between the shots. The difference in the kickback voltages causes the difference in the luminance between the shots and deteriorating the flickering.

SUMMARY OF THE INVENTION

A motivation of the present invention is to solve the problems of the conventional art.

A thin film transistor array panel is provided, which includes: a substrate; a first signal line formed on the substrate; a second signal line formed on the substrate and intersecting the first signal line; a thin film transistor including a gate electrode connected to the first signal line and having an edge substantially parallel to the first signal line, a source electrode connected to the second signal line, and a drain electrode overlapping the edge of the gate electrode; and a pixel electrode connected to the drain electrode.

Preferably, the edge of the gate electrode is substantially perpendicular to the second signal line.

The source electrode may partly enclose a portion of the drain electrode and may have an edge that faces the drain electrode and has a shape of hook or horseshoe.

The source electrode and the drain electrode may have edges that face each other and are rectilinear.

The pixel electrode may have a cutout that may make an angle of about 45 degrees with the first signal line. The pixel electrode may have a chamfered edge parallel to the cutout.

The pixel electrode may have a plurality of cutouts arranged symmetrical with respect to a transverse line bisecting the pixel electrode.

The thin film transistor array panel may further include a third signal line separated from the first and the second signal lines and overlapping the pixel electrode, and a storage electrode connected to the third signal line and overlapping the cutouts.

A method of manufacturing a thin film transistor array panel is provided, which include: forming a gate line on a substrate, the gate line including a gate electrode that has an edge; depositing a gate insulating layer; forming a semiconductor layer on the gate insulating layer; forming a drain electrode overlapping the edge of the gate electrode and a data line including a source electrode that is disposed at least on the semiconductor layer; forming a passivation layer; and forming a pixel electrode connected to the drain electrode, wherein the formation of the drain electrode and the data line includes photolithography with divisional exposure that scans perpendicular to the edge of the gate electrode.

The formation of the semiconductor layer and the formation of the drain electrode and the data line may include a single photolithography.

The pixel electrode may include ITO or IZO.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
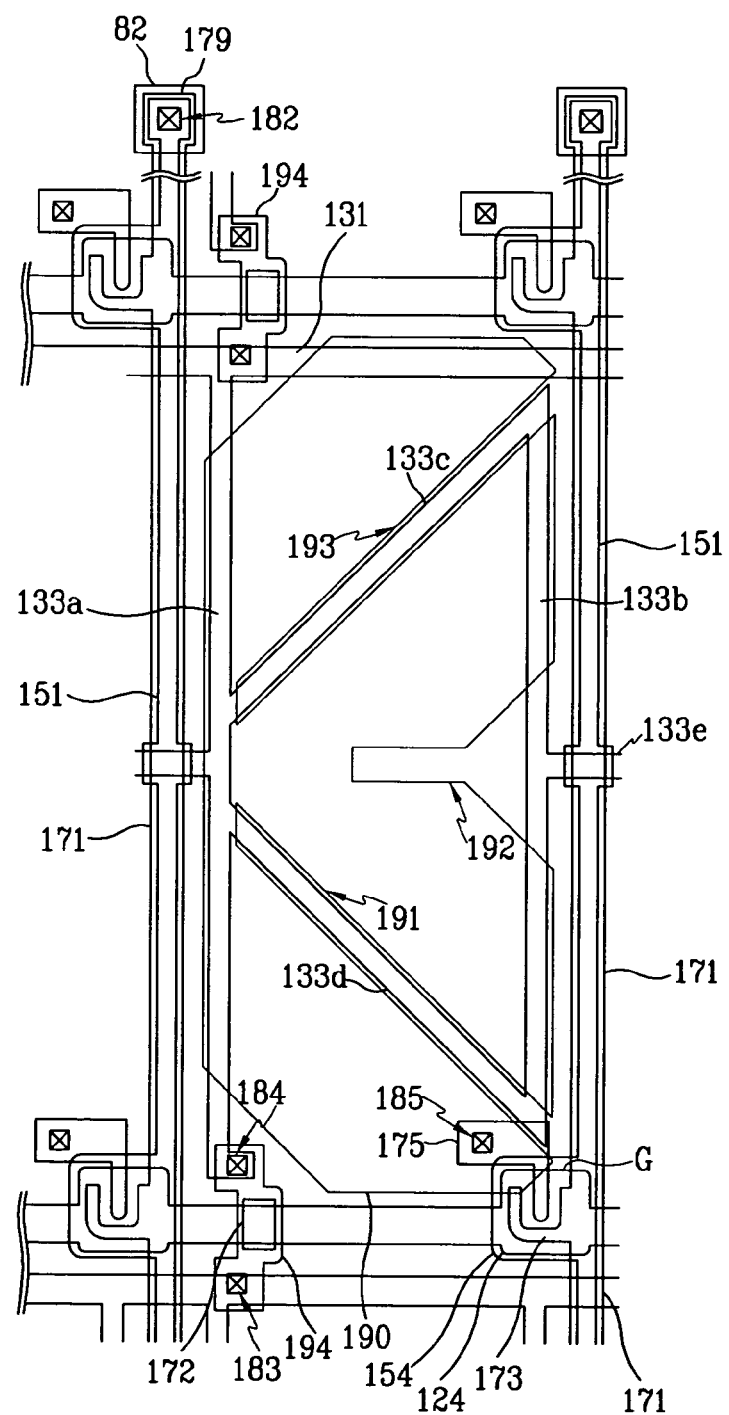
FIG. 1 is a layout view of a TFT array panel of an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, LCDs including TFT array panels and common electrode panels and manufacturing methods thereof according to embodiments of the present invention will be described with reference to the accompanying drawings.

An LCD according to an embodiment of the present invention will be described in detail with reference to FIGS. 1–4.

Figure 2:
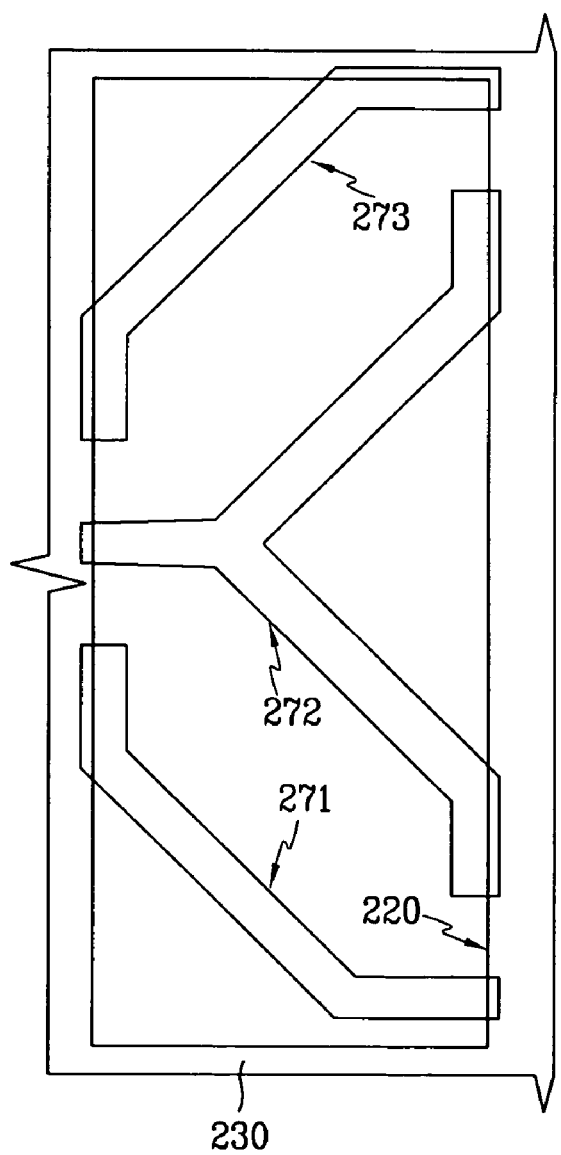
FIG. 2 is a layout view of a common electrode panel of an LCD according to an embodiment of the present invention.
Figure 3:
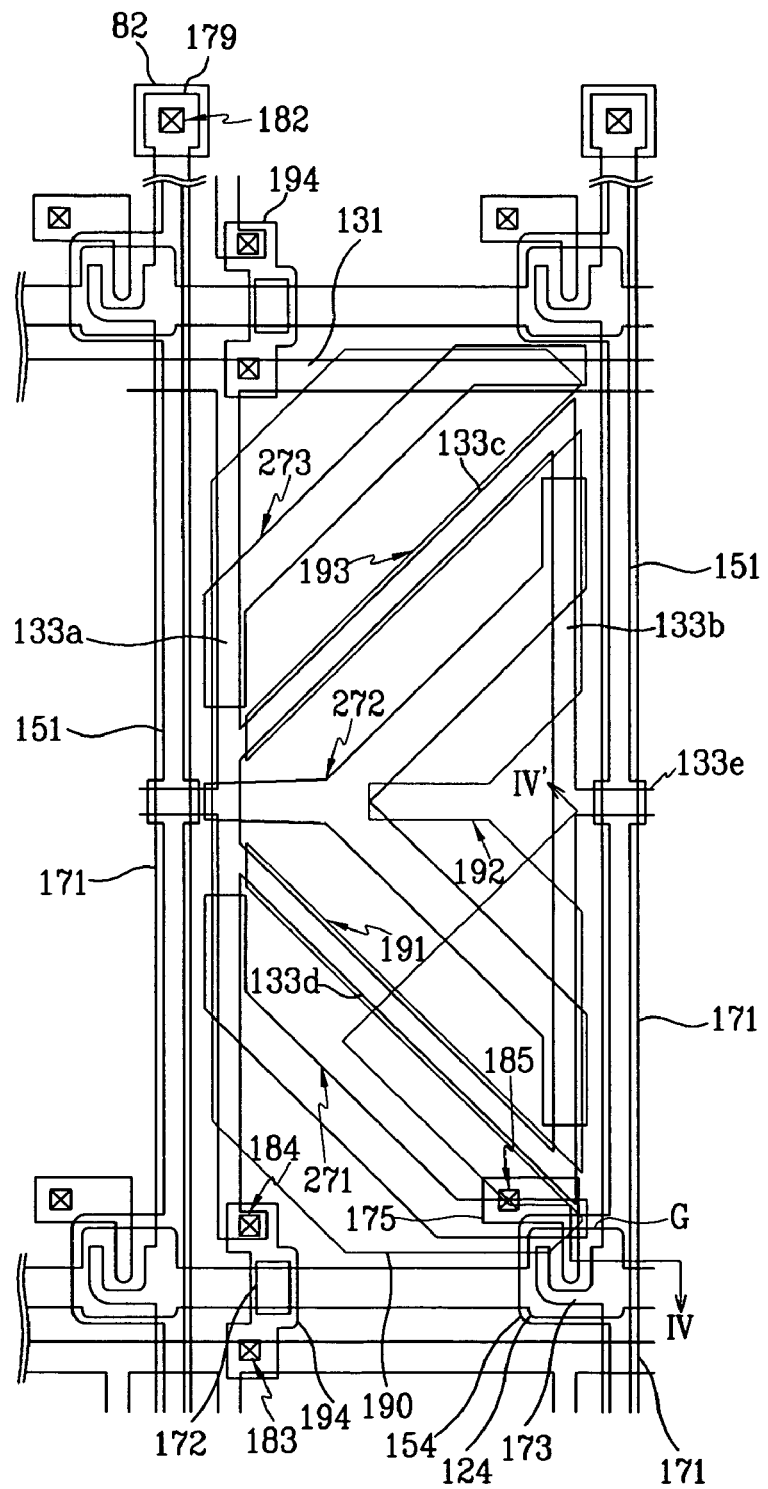
FIG. 3 is a layout view of an LCD including the TFT array panel shown in FIG. 1 and the common electrode panel shown in FIG. 2.
Figure 4:
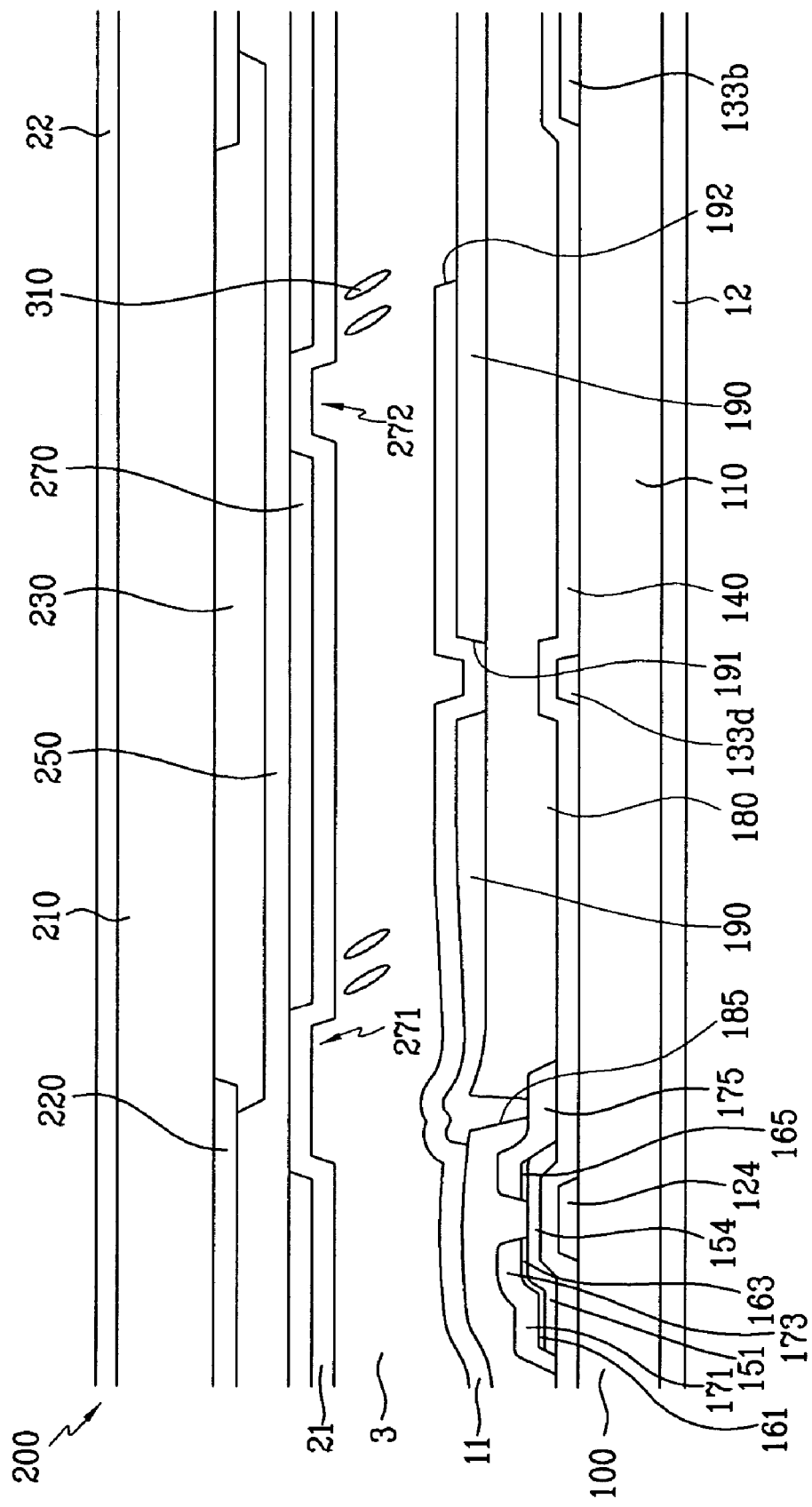
FIG. 4 is a sectional view of the LCD shown in FIG. 3 taken along the line IV–IV'.

FIG. 1 is a layout view of a TFT array panel of an LCD according to an embodiment of the present invention, FIG. 2 is a layout view of a common electrode panel of an LCD according to an embodiment of the present invention, FIG. 3 is a layout view of an LCD including the TFT array panel shown in FIG. 1 and the common electrode panel shown in FIG. 2, and FIG. 4 is a sectional view of the LCD shown in FIG. 3 taken along the line IV–IV'.

An LCD according to an embodiment of the present invention includes a TFT array panel 100, a common electrode panel 200, and a LC layer 3 interposed between the panels 100 and 200 and containing a plurality of LC molecules 310 aligned substantially vertical to surfaces of the panels 100 and 200.

The TFT array panel 100 is now described in detail with reference FIGS. 1, 3 and 4.

A plurality of gate lines 121 and a plurality of storage electrode lines 131 are formed on an insulating substrate 110 such as transparent glass.

The gate lines 121 extend substantially in a transverse direction and are separated from each other and transmit gate signals. Each gate line 121 includes a plurality of projections forming a plurality of gate electrodes 124. Each gate electrode 124 has an upper edge G substantially parallel to the extension direction of the gate lines 121. Each gate line 121 may include an end portion having a large area for connection with an external driving circuit.

Each storage electrode line 131 extends substantially in the transverse direction and is disposed between adjacent two of the gate lines 121 and close to upper one of the two gate lines 121. Each storage electrode line 131 includes a plurality of sets of branches 133a–133d and a plurality of connections 133e connecting the branches 133a–133d.

A set of branches 133a–133d includes two longitudinal branches forming first and second storage electrodes 133a and 133b and spaced apart from each other and two oblique branches forming third and fourth storage electrodes 133c and 133d and connected between the first and the second storage electrodes 133a and 133b. In detail, the first storage electrode 133a has a free end portion and a fixed end portion that is connected to the storage electrode line 131 and has a projection. The third and the fourth storage electrodes 133c and 133d extend approximately from a center of the first storage 133a and upper and lower ends of the second storage electrode 133b, respectively.

Each of the connections 133e is connected between a first storage electrode 133a of a set of storage electrodes 133a–133d and a second storage electrode 133b of another set of storage electrodes 133a–133d adjacent thereto.

The storage electrode lines 131 are supplied with a predetermined voltage such as a common voltage, which is applied to a common electrode 270 on the common electrode panel 200 of the LCD. Each storage electrode line 131 may include a pair of stems extending in the transverse direction.

The gate lines 121 and the storage electrode lines 131 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate lines 121 and the storage electrode lines 131 may have a multi-layered structure including two films having different physical characteristics. One of the two films is preferably made of low resistivity metal including Al containing metal for reducing signal delay or voltage drop in the gate lines 121 and the storage electrode lines 131. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film. The gate lines 121 and the storage electrode lines 131 may have a triple-layered structure including a lower Mo film, an intermediate Al film, and an upper Mo film.

In addition, the lateral sides of the gate lines 121 and the storage electrode lines 131 are inclined relative to a surface of the substrate, and the inclination angle thereof ranges about 20–80 degrees.

A gate insulating layer 140 preferably made of silicon nitride (SiNx) is formed on the gate lines 121 and the storage electrode lines 131.

A plurality of semiconductor stripes 151 preferably made of hydrogenated amorphous silicon (abbreviated to "a-Si") or polysilicon are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+ hydrogenated a-Si heavily doped with n type impurity such as phosphorous are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate, and the inclination angles thereof are preferably in a range between about 30–80 degrees.

A plurality of data lines 171, a plurality of drain electrodes 175 separated from the data lines 171, and a plurality of isolated metal pieces 172 are formed on the ohmic contacts 161 and 165 and the gate insulating layer 140.

The data lines 171 for transmitting data voltages extend substantially in the longitudinal direction and crossing the gate lines 121 at right angles. The data lines 171 also intersect the storage electrode lines 131 and the connections 133e such that each data line 171 is disposed between the first and the second storage electrodes 133a and 133b in adjacent sets of the branches 133a–133c of the storage electrode lines 131. Each data line 171 includes an end portion 179 having a large area for contact with another layer or an external device. A plurality of branches of each data line 171, which project toward the drain electrodes 175, form a plurality of curved (like a hook, horseshoe, character "J", or character "U") source electrodes 173.

The drain electrodes 175 overlap the gate electrodes 124 and in particular, they overlap the upper edges G of the gate electrodes 124 that extends substantially parallel to the extension direction of the gate lines 121 and substantially perpendicular to the extension direction of the data lines 171. Then, the overlapping area between a drain electrode 175 and a gate electrode 124 is kept constant although the drain electrode 175 moves along the upper edge G of the gate electrode 124, i.e., in the extension direction of the gate lines 121.

Each drain electrode 175 includes an end portion having a large area for contact with another layer and another end portion disposed on a gate electrode 124 and partly enclosed by a curved source electrode 173. A gate electrode 124, a source electrode 173, and a drain electrode 175 along with a projection 154 of a semiconductor stripe 151 form a TFT having a channel formed in the projection 154 disposed between the source electrode 173 and the drain electrode 175. The curved source electrode 173 increases the channel length of the TFT. However, the source electrode 173 and the drain electrode 175 may have rectilinear edges facing each other.

The metal pieces 172 are disposed on the gate lines 121 near the end portions of the storage electrodes 133a.

The data lines 171, the drain electrodes 175, and the metal pieces 172 are preferably made of refractory metal such as Cr, Mo, Ti, Ta or alloys thereof and they may also have a multilayered structure including a film (not shown) preferably made of Mo, Mo alloy or Cr and another film (not shown) preferably made of Al containing metal. Alternatively, the data lines 171, etc., include triple layers interposing an intermediate layer of Al or Al alloy.

Like the gate lines 121 and the storage electrode lines 131, the data lines 171 and the drain electrodes 175 have tapered lateral sides, and the inclination angles thereof range about 30–80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175.

The passivation layer 180 has a plurality of contact holes 182 and 185 exposing the end portions 179 of the data lines 171 and the drain electrodes 175, respectively. In addition, the passivation layer 180 and the gate insulating layer 140 have a plurality of contact holes 181 exposing the end portions 129 of the gate lines 121. It is preferable that the contact holes 181, 182 and 185 do not expose Al containing metal, and if they expose Al containing metal, the exposed Al containing metal is preferably removed by blanket etch.

The contact holes 181, 182 and 185 may expose edges of the end portions 129 and 179 and the drain electrodes 175. A passivation layer 180 is formed on the data lines 171, the drain electrodes 175, the metal pieces 172, and the exposed portions of the semiconductor stripes 151. The passivation layer 180 is preferably made of photosensitive organic material having a good flatness characteristic, low dielectric insulating material having dielectric constant lower than 4.0 such as a-Si:C:O and a-Si:O:F formed by plasma enhanced chemical vapor deposition (PECVD), or inorganic material such as silicon nitride. The passivation layer 180 may have a double-layered structure including a lower inorganic film and an upper organic film.

The passivation layer 180 has a plurality of contact holes 182 and 185 exposing the end portions 179 of the data lines 171 and the end portions of the drain electrodes 175, respectively. The passivation layer 180 and the gate insulating layer 140 have a plurality of contact holes 183 exposing portions of the storage electrode lines 131 near the fixed end portions of the first storage electrodes 133a and a plurality of contact holes 185 exposing the projections of the free end portions of the first storage electrodes 133a, respectively.

A plurality of pixel electrodes 190, a plurality of contact assistants 82, and a plurality of storage bridges 194, which are preferably made of ITO or IZO, are formed on the passivation layer 180.

The pixel electrodes 190 are physically and electrically connected to the drain electrodes 175 through the contact holes 185 such that the pixel electrodes 190 receive the data voltages from the drain electrodes 175.

The pixel electrodes 190 supplied with the data voltages generate electric fields in cooperation with the common electrode 270, which determine the orientations of liquid crystal molecules 310 in the liquid crystal layer 3.

A pixel electrode 190 and the common electrode 270 form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the storage electrode lines 131 including the storage electrodes 133a–133c.

Each pixel electrode 190 is chamfered at its four corners and the chamfered edges of the pixel electrode 190 make an angle of about 45 degrees with the gate lines 121.

Each pixel electrode 190 has a lower cutout 191, a center cutout 192, and an upper cutout 193, which partition the pixel electrode 190 into a plurality of partitions. The cutouts 191, 192 and 193 substantially have an inversion symmetry with respect to an imaginary transverse line bisecting the pixel electrode 190.

The lower and the upper cutouts 191 and 193 obliquely extend from a right edge of the pixel electrode 190 near an upper right corner approximately to a center of a left edge of the pixel electrode 190 and overlap the third and the fourth storage electrodes 133c and 133d. The lower and the upper cutouts 191 and 193 they are disposed at lower and upper halves of the pixel electrode 190, respectively, which can be divided by the imaginary transverse line. The lower and the upper cutouts 191 and 193 make an angle of about 45 degrees to the gate lines 121, and they extend substantially perpendicular to each other.

The center cutout 192 extends along the imaginary transverse line and has an inlet from the right edge of the pixel electrode 190, which has a pair of inclined edges substantially parallel to the lower cutout 191 and the upper cutout 193, respectively.

Accordingly, the lower half of the pixel electrode 190 is partitioned into two lower partitions by the lower cutout 191 and the upper half of the pixel electrode 190 is also partitioned into two upper partitions by the upper cutout 193. The number of partitions or the number of the cutouts is varied depending on the design factors such as the size of pixels, the ratio of the transverse edges and the longitudinal edges of the pixel electrodes, the type and characteristics of the liquid crystal layer 3, and so on.

The contact assistants 82 are connected to the end portions the end portions 179 of the data lines 171 through the contact holes 182, respectively. The contact assistants 82 protect the end portions 179 and complement the adhesion of the end portions 129 and 179 and external devices.

The storage bridges 194 cross over the gate lines 121 and they are connected to the exposed projection of the fixed end portions of the first storage electrodes 133a and the exposed portions of the storage electrode lines 131 through the contact holes 184 and 183, respectively, which are disposed opposite each other with respect to the gate lines 121. The storage bridges 194 overlaps the metal pieces 172 and they may be electrically connected to the metal pieces 172. The storage electrode lines 131 including the storage electrodes 133a–133c along with the storage bridges 194 and the metal pieces 172 are used for repairing defects in the gate lines 121, the data lines 171, or the TFTs. The electrical connection between the gate lines 121 and the storage electrode lines 131 for repairing the gate lines 121 is obtained by illuminating the cross points of the gate lines 121 and the storage bridges 194 by a laser beam to electrically connect the gate lines 121 to the storage bridges 194. In this case, the metal pieces 172 enhance the electrical connection between the gate lines 121 and the storage bridges 194.

The description of the common electrode panel 200 follows with reference to FIGS. 2–4.

A light blocking member 220 called a black matrix for preventing light leakage is formed on an insulating substrate 210 such as transparent glass. The light blocking member 220 may include a plurality of openings that face the pixel electrodes 190 and it may have substantially the same shape as the pixel electrodes 190. Otherwise, the light blocking member 220 may include linear portions corresponding to the data lines 171 and other portions corresponding to the TFTs.

A plurality of color filters 230 are formed on the substrate 210 and they are disposed substantially in the areas enclosed by the light blocking member 220. The color filters 230 may extend substantially along the longitudinal direction along the pixel electrodes 190. The color filters 230 may represent one of the primary colors such as red, green and blue colors.

An overcoat 250 for preventing the color filters 230 from being exposed and for providing a flat surface is formed on the color filters 230 and the light blocking member 220.

A common electrode 270 preferably made of transparent conductive material such as ITO and IZO is formed on the overcoat 250.

The common electrode 270 has a plurality of sets of cutouts 271–273.

A set of cutouts 271–273 face a pixel electrode 190 and include a lower cutout 271, a center cutout 272, and an upper cutout 273. Each of the cutouts 271–273 is disposed between adjacent cutouts 191–193 of the pixel electrode 190 or between a cutout 191 or 193 and a chamfered edge of the pixel electrode 190. In addition, each of the cutouts 271–273 has at least an oblique portion extending parallel to the lower cutout 191 or the upper cutout 193 of the pixel electrode 190, and the distances between adjacent two of the cutouts 271–273 and 191–193, the oblique portions thereof, the oblique edges thereof, and the chamfered edges of the pixel electrode 190, which are parallel to each other, are substantially the same. The cutouts 271–273 substantially have an inversion symmetry with respect to a third storage electrode 133c.

Each of the lower and upper cutouts 271 and 273 includes an oblique portion extending approximately from a left edge of the pixel electrode 190 approximately to a lower or upper edge of the pixel electrode 190, and transverse and longitudinal portions extending from respective ends of the oblique portion along edges of the pixel electrode 190, overlapping the edges of the pixel electrode 190, and making obtuse angles with the oblique portion.

The center cutout 272 includes a central transverse portion extending approximately from the left edge of the pixel electrode 190 along the third storage electrode 133c, a pair of oblique portions extending from an end of the central transverse portion approximately to a right edge of the pixel electrode and making obtuse angles with the central transverse portion, and a pair of terminal longitudinal portions extending from the ends of the respective oblique portions along the right edge of the pixel electrode 190, overlapping the right edge of the pixel electrode 190, and making obtuse angles with the respective oblique portions.

The number of the cutouts 271–273 may be varied depending on the design factors, and the light blocking member 220 may also overlap the cutouts 271–273 to block the light leakage through the cutouts 271–273.

Alignment layers 11 and 21 that may be homeotropic are coated on inner surfaces of the panels 100 and 200, and polarizers 12 and 22 are provided on outer surfaces of the panels 100 and 200 such that their polarization axes may be crossed and one of the transmissive axes may be parallel to the gate lines 121. One of the polarizers may be omitted when the LCD is a reflective LCD.

The LCD may further include at least one retardation film for compensating the retardation of the LC layer 3.

It is preferable that the LC layer 3 has negative dielectric anisotropy and it is subjected to a vertical alignment that the LC molecules 310 in the LC layer 3 are aligned such that their long axes are substantially vertical to the surfaces of the panels 100 and 200 in absence of electric field.

As shown in FIG. 3, a set of the cutouts 191–193 and 271–273 divides a pixel electrode 190 into a plurality of sub-areas and each sub-area has two major edges.

The cutouts 191–193 and 271–273 control the tilt directions of the LC molecules in the LC layer 3. This will be described in detail.

Upon application of the common voltage to the common electrode 270 and a data voltage to the pixel electrodes 190, an electric field substantially perpendicular to the surfaces of the panels 100 and 200 is generated. The LC molecules 310 tend to change their orientations in response to the electric field such that their long axes are perpendicular to the field direction.

The cutouts 191–193 and 271–273 of the electrodes 190 and 270 and the edges of the pixel electrodes 190 distort the electric field to have a horizontal component that is substantially perpendicular to the edges of the cutouts 191–193 and 271–273 and the edges of the pixel electrodes 190. Accordingly, the LC molecules on each sub-area are tilt in a direction by the horizontal component and the azimuthal distribution of the tilt directions are localized to four directions, thereby increasing the viewing angle of the LCD.

The width of the cutouts 191–193 and 271–273 is preferably in a range between about nine microns to about twelve microns.

At least one of the cutouts 191–193 and 271–273 can be substituted with protrusions (not shown) or depressions (not shown). The protrusions are preferably made of organic or inorganic material and disposed on or under the field-generating electrodes 190 or 270 and have a width of about five microns to about ten microns.

The shapes and the arrangements of the cutouts 191–193 and 271–273 may be modified.

Now, a method of manufacturing the TFT array panel shown in FIGS. 1, 3 and 4 is described in detail with reference to FIGS. 5–13.

A manufacturing method of the TFT array panel according to this embodiment includes several photolithography steps for forming gate lines 121, data lines 171, pixel electrodes 190, etc. The photolithography step includes coating of photoresist film and exposure of the photoresist film with a pattern mask. At this time, when an active area including thin film patterns is larger than the pattern mask, the entire exposure is accomplished by dividing the active area and repeating a divisional exposure called step-and-repeat process. That is, when a pattern is formed by depositing and photo-etching a conductive layer or an insulating layer, a photoresist on the active area is required to be exposed to light after dividing the active area into a plurality of shots, which will be described in detail.

Figure 5:
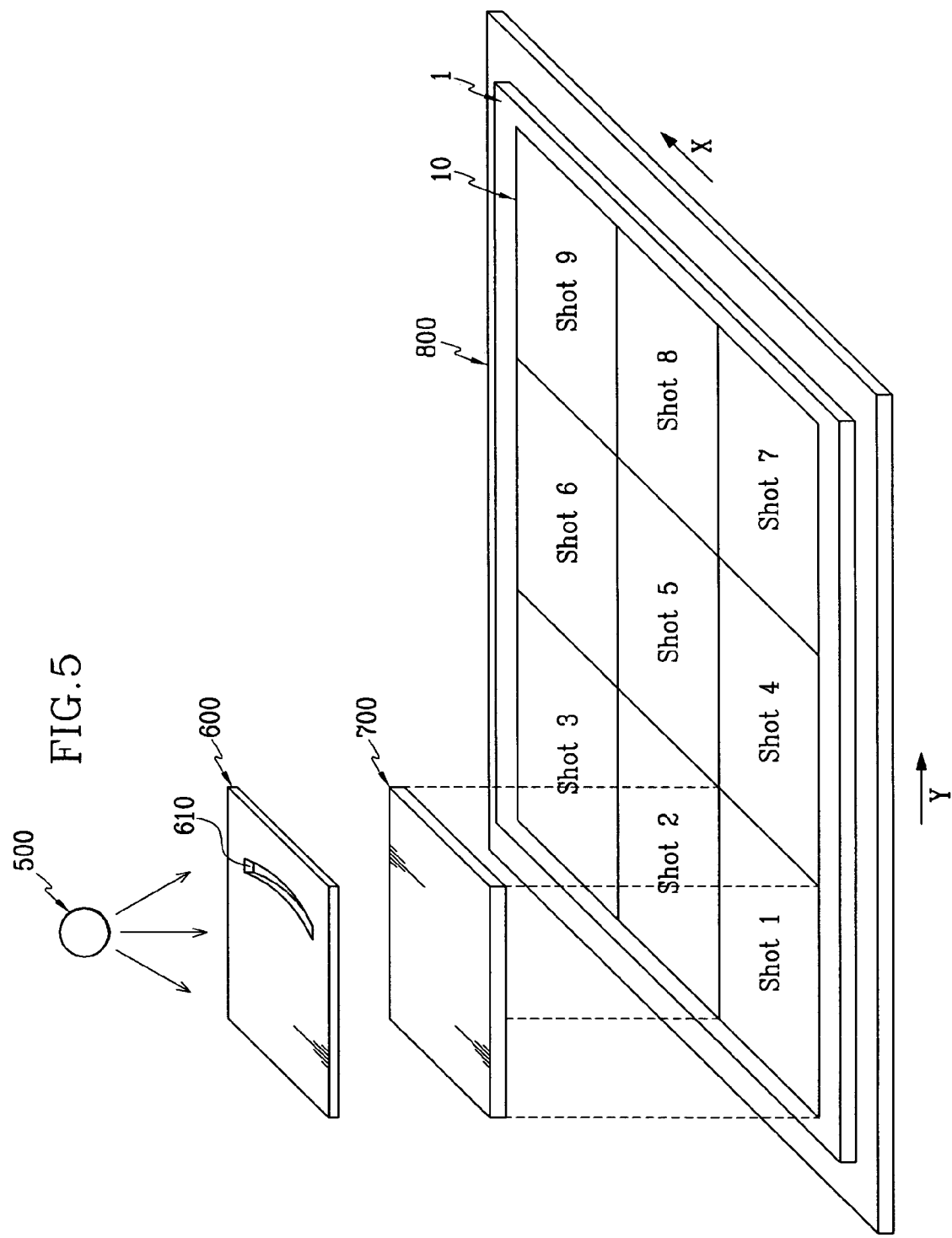
FIG. 5 illustrates an exposure step in a manufacturing method of the TFT array panel according to an embodiment of the present invention.

FIG. 5 illustrates an exposure step in a manufacturing method of the TFT array panel according to an embodiment of the present invention.

Referring to FIG. 5, an exposure equipment according to an embodiment of the present invention includes a light source 500, an exposure mask 600 including a slit 610 that defines a transmission area for restrictively transmitting the light from the light source 500, a pattern mask 700 including blocking areas and transmissive areas for selectively blocking and transmitting the light corresponding to thin film patterns, and a plate 800 for fixing and supporting a mother substrate 1 to be provided with the thin films, the mother substrate 1.

At this time, the mother substrate 1 is used for manufacturing one or more TFT array panels.

An active area 10 covered with a photoresist is divided into several exposure areas that are separately exposed to light by so called shots. FIG. 5 shows first to ninth shots and the exposure areas are also referred to as the shots.

A divisional exposure is performed by fixing the light source 500 and the exposure mask 600 and first moving the pattern mask 700 and the plate 800 in Y-direction by a pitch (or a distance between the shots). After scanning along the Y-direction, the pattern mask 700 and the plate 800 is moved in X-direction by a pitch and the scanning along the Y-direction is performed again. In each shot, the light passing through the slit 610 of the exposure mask 600 is selectively transmitted by the pattern formed on the pattern mask 700 and reaches to the photoresist on the substrate 1. The shot is repeatedly performed nine times with moving the pattern mask 700 and the plate 800 since the active area 10 has nine shots. Instead of moving the pattern mask 700 and the plate 800, the light source 500 and the exposure mask 600 may be moved.

The slit 610 of the exposure mask 600 defines a transmission area transmitting the light source 50, and the light intensity passing through the slit 610 has an error of about ±10%. At this time, the light from the light source 500 is radially irradiated and the slit 610 has a shape of arc.

FIGS. 6, 8, 10 and 12 are layout views of the TFT array panel shown in FIGS. 1, 3 and 4 in intermediate steps of a manufacturing method thereof according to an embodiment of the present invention, and FIGS. 7, 9, 11 and 13 are sectional views of the TFT array panel shown in FIGS. 6, 8, 10 and 12 taken along the lines VII–VII', IX–IX', XI–XI', and XIII–XIII', respectively.

A conductive film is sputtered on an insulating substrate 110 such as transparent glass. The conductive film is preferably made of a metal such as Cr, Mo, and Mo alloy, which has good contact characteristics with ITO or IZO, or Al containing metal.

Figure 6:
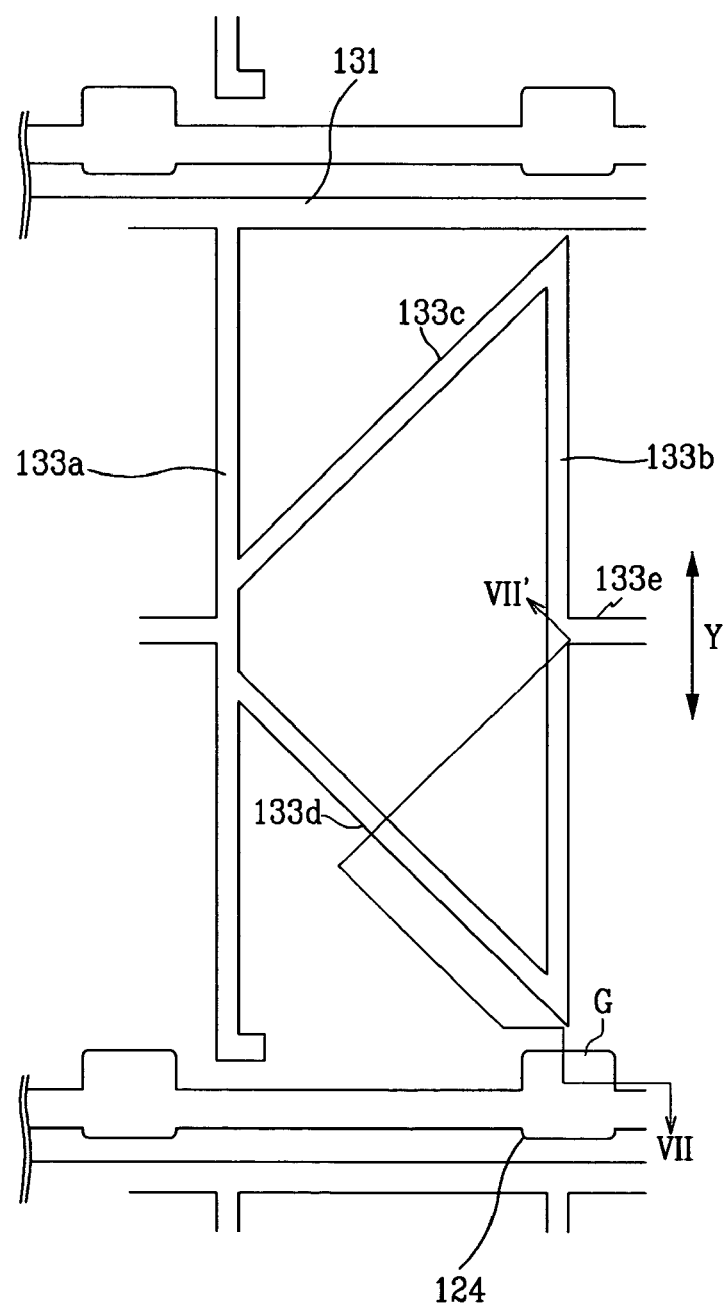
FIGS. 6, 8, 10 and 12 are layout views of the TFT array panel shown in FIGS. 1, 3 and 4 in intermediate steps of a manufacturing method thereof according to an embodiment of the present invention.
Figure 7:
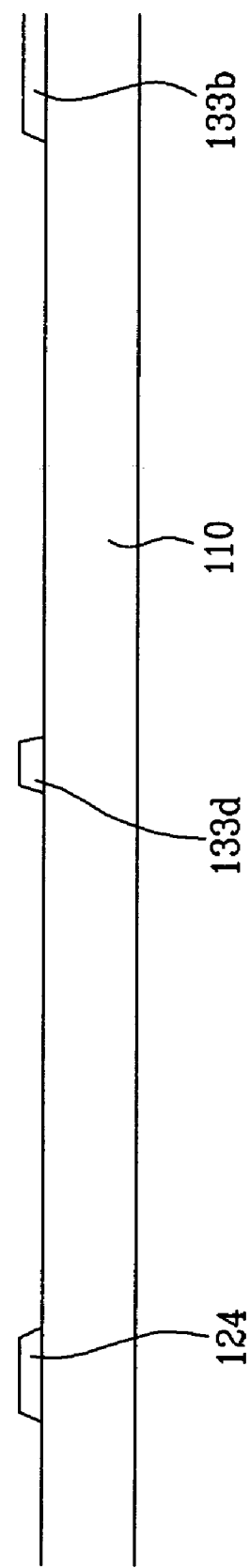
FIGS. 7, 9, 11 and 13 are sectional views of the TFT array panel shown in FIGS. 6, 8, 10 and 12 taken along the lines VII–VII', IX–IX', XI–XI', and XIII–XIII', respectively.

Referring to FIGS. 6 and 7, the conductive film is patterned by photolithography and etching with a gate pattern mask (not shown) to form a plurality of gate lines 121 including a plurality of gate electrodes 124 and a plurality of storage electrode lines 131 including storage electrodes 133a–133d and connections 133e. The photolithography using the gate pattern mask includes coating of a photoresist film on the conductive film, the above-described divisional exposure with the gate pattern mask, and development of the photoresist film. The gate pattern mask is designed such that upper edges G of the gate electrodes 124 are perpendicular to a scanning direction, i.e., Y-direction. An Al film may be etched using an Al etchant including 8–15% $CH_3COOH$, 5–8% $HNO_3$, 50–60% $H_3PO_4$, and remaining $H_2O$, which gives inclined edge profiles. The above-described etchant can also etch Mo with giving inclined etch profiles.

Figure 8:
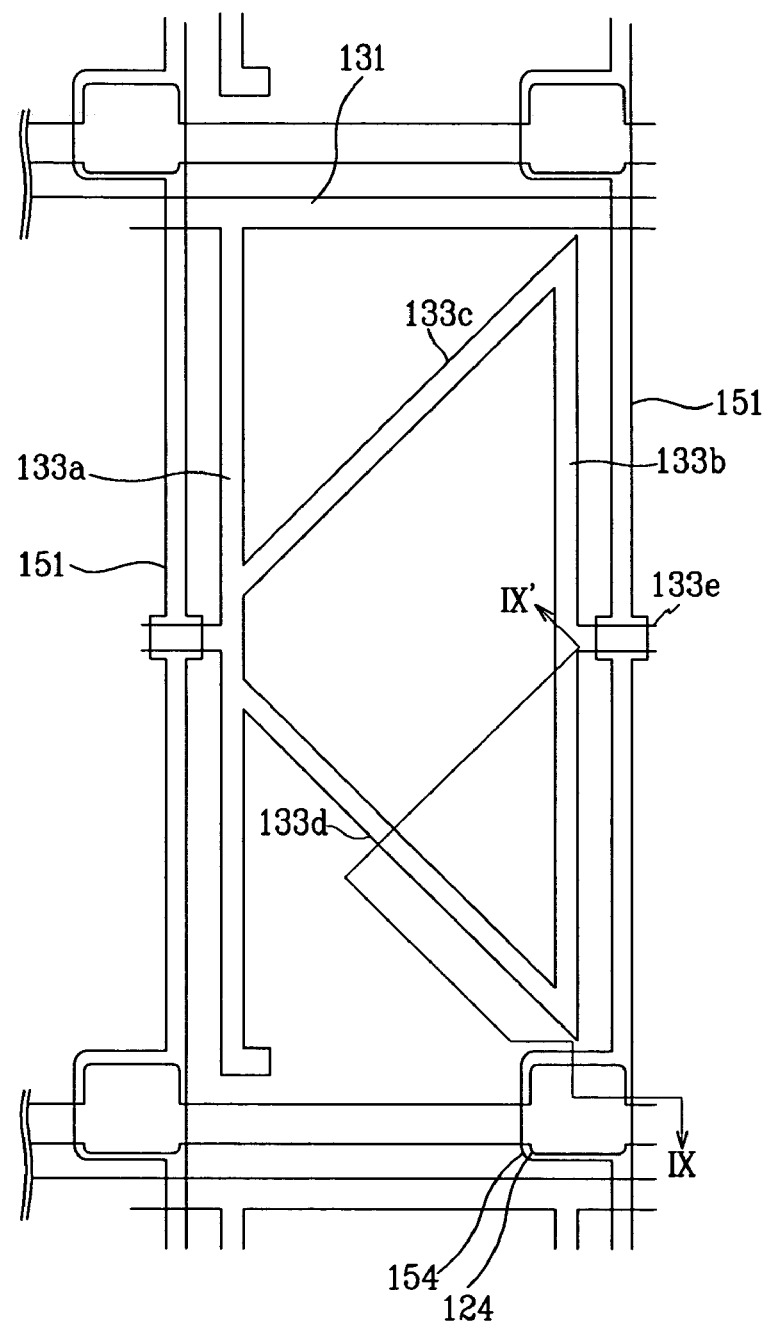
Figure 9:
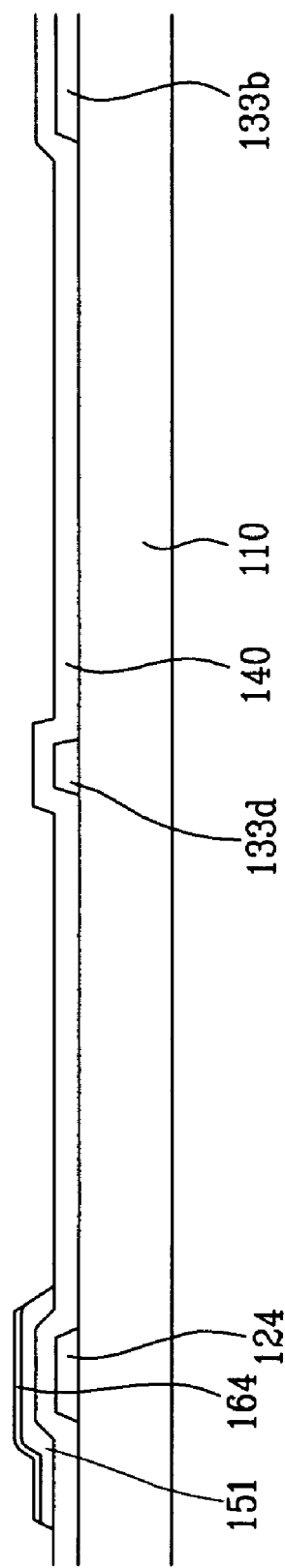

Referring to FIGS. 8 and 9, after sequential deposition of a gate insulating layer 140, an intrinsic a-Si layer, and an extrinsic a-Si layer, the extrinsic a-Si layer and the intrinsic a-Si layer are photo-etched with a semiconductor pattern mask (not shown) to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,000 Å to about 5,000 Å, and the deposition temperature is preferably in a range of about 250–500° C.

Figure 10:
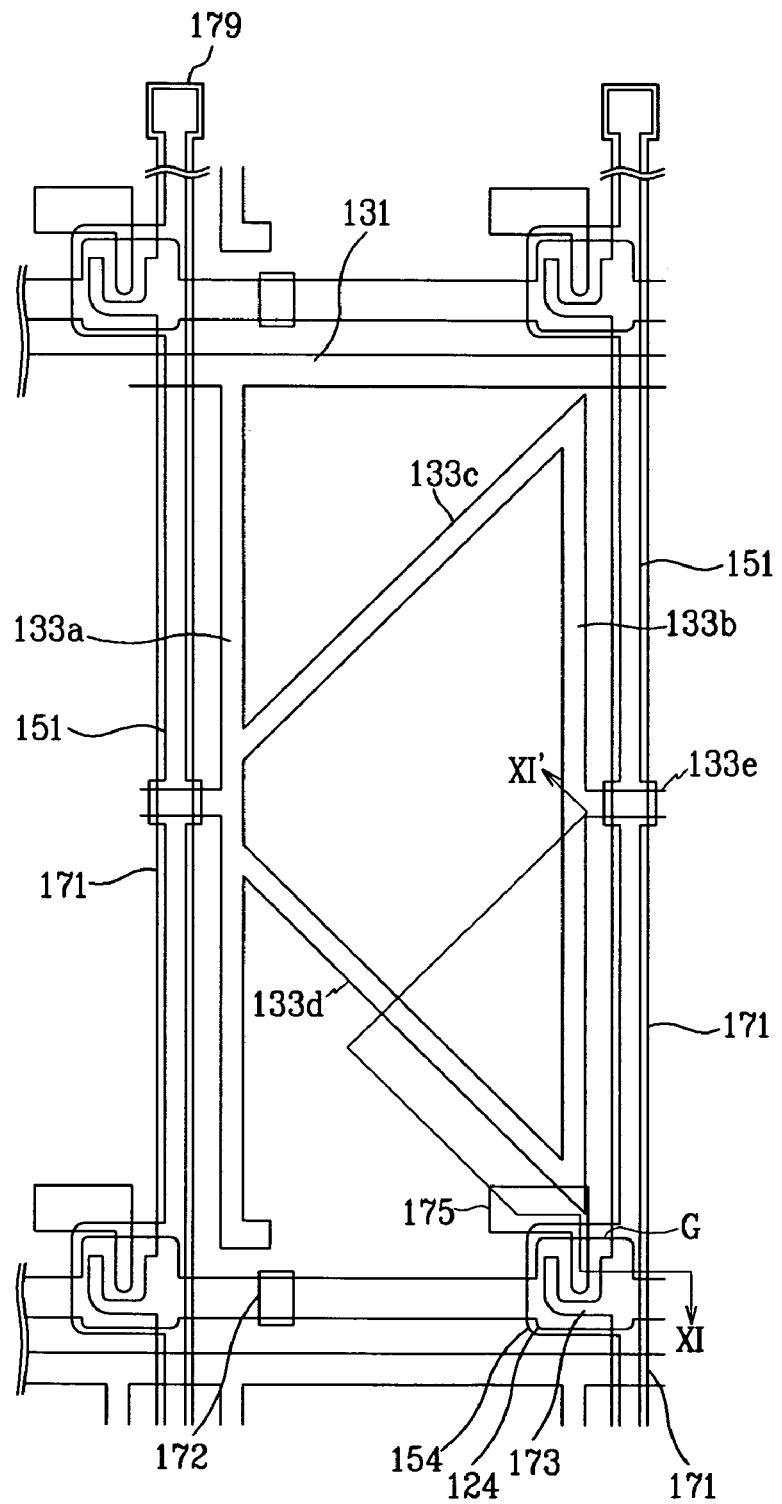
Figure 11:
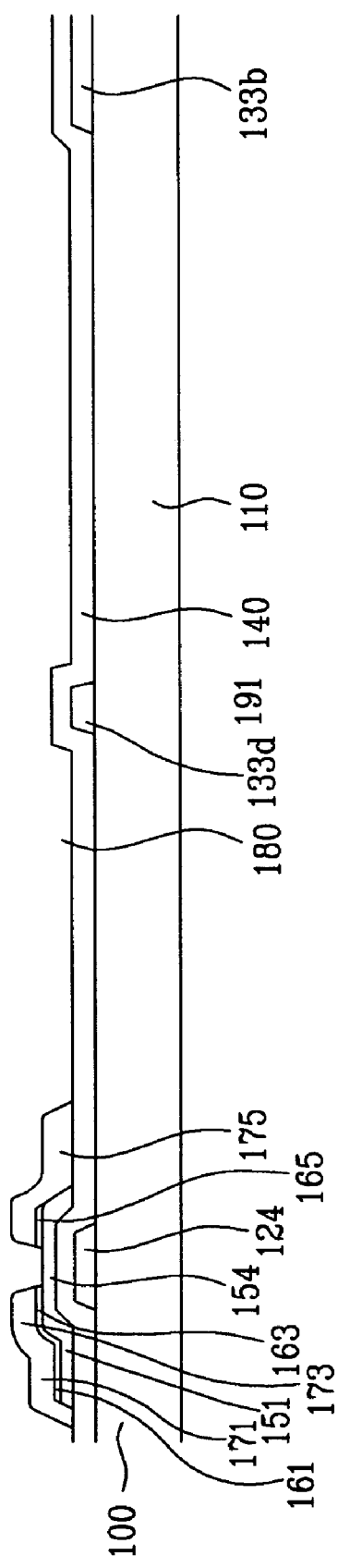

Referring to FIGS. 9 and 10, a conductive layer preferably including a Mo, Mo alloy, or Cr film and an Al or Al alloy film is sputtered and photolithography and etch using a data pattern mask (not shown) to form a plurality of data lines 171 including a plurality of source electrodes 173, a plurality of drain electrodes 175, a plurality of metal pieces.

The photolithography also includes coating of another photoresist film on the conductive layer, the above-described divisional exposure with the data pattern mask, and development of the photoresist film. The data pattern mask is designed such that the drain electrodes 175 overlap the upper edges G of the gate electrodes 124. Accordingly, the overlapping area between a drain electrode 175 and a gate electrode 124 is kept constant for all shots. Accordingly, the parasitic capacitance between the drain electrodes 175 and the gate electrodes 124 is substantially the same for all the shots and thus the stitch defect, i.e., the luminance difference recognized near the boundaries of the shots and the flickering is reduced, thereby improving the display characteristics of the display device.

Before or after removing the photoresist, portions of the extrinsic semiconductor stripes 164, which are not covered with the data lines 171, the drain electrodes 175, and the metal pieces 172, are removed by etch to complete a plurality of ohmic contact stripes 161 including a plurality of projections 163 and a plurality of ohmic contact islands 165 and to expose portions of the intrinsic semiconductor stripes 151. In case that the exposed portions of the extrinsic semiconductor stripes 164 is removed using the data lines 171, the drain electrodes 175, and the metal pieces 172 as an etch mask after removing the photoresist film, the extrinsic semiconductor stripes 164 are dry etched preferably using $CF_4$+HCl in order to prevent the damage on the Mo containing films of the data lines 171, etc.

Oxygen plasma treatment may follow thereafter in order to stabilize the exposed surfaces of the semiconductor stripes 151.

Figure 12:
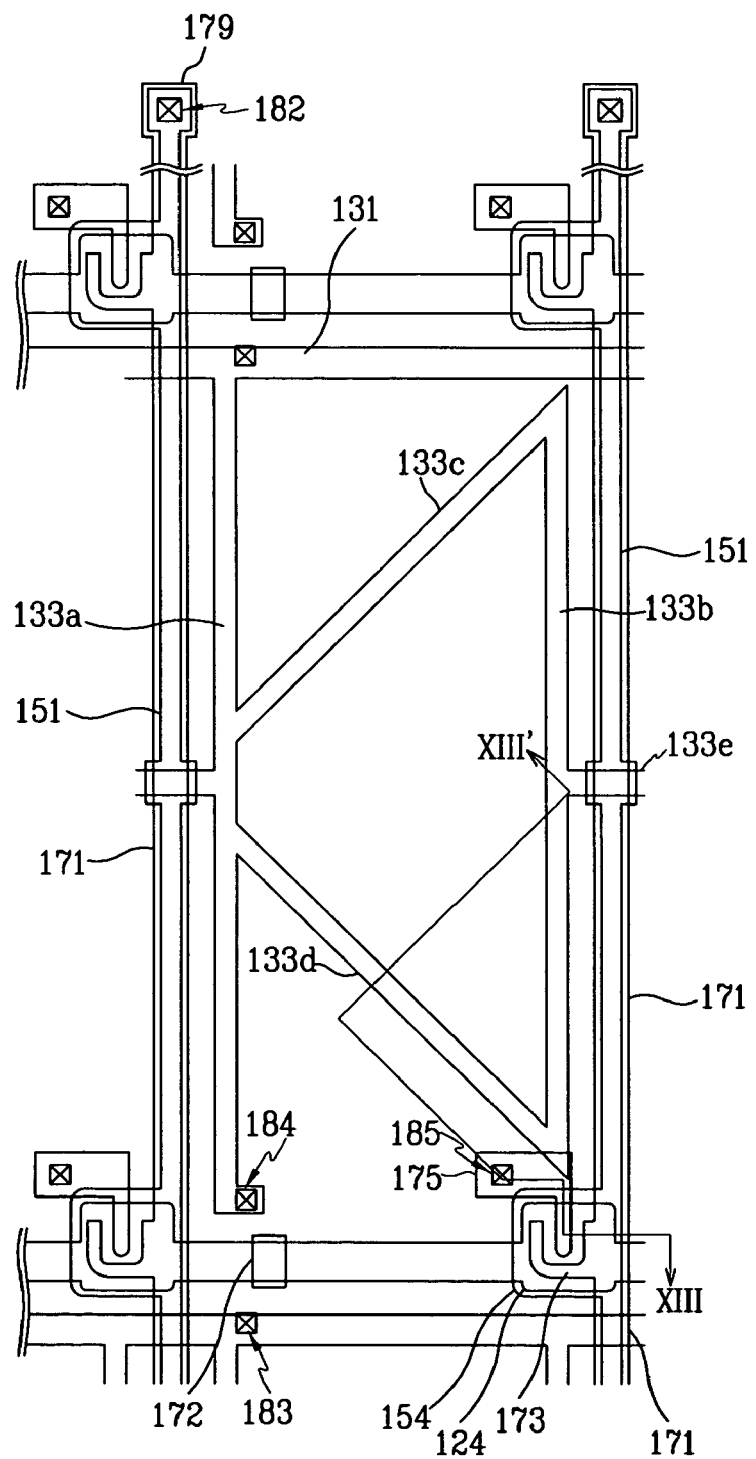
Figure 13:
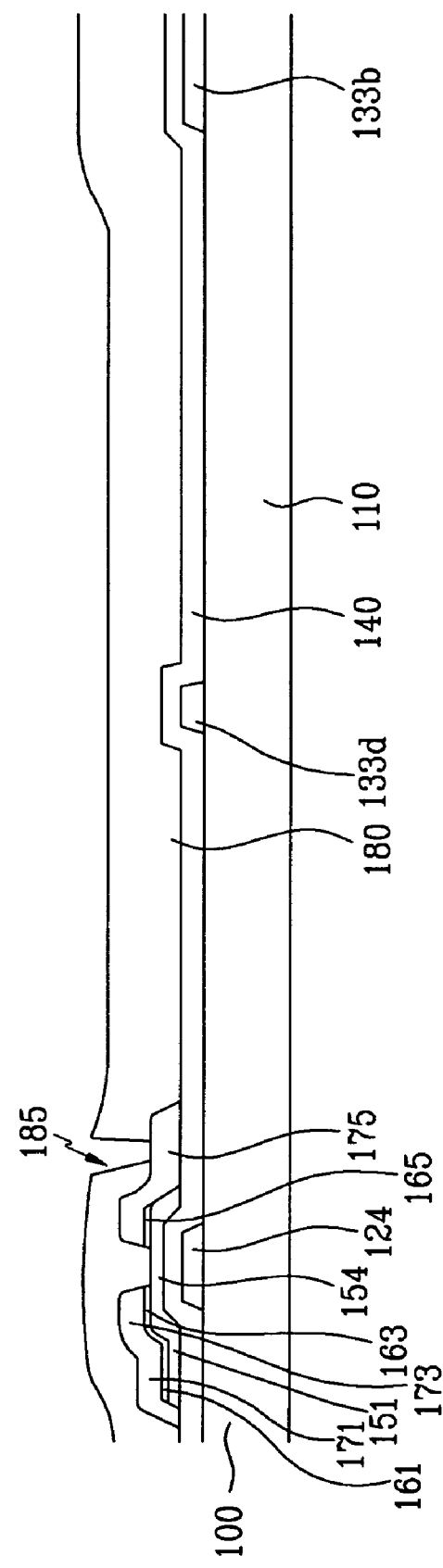

Referring to FIGS. 12 and 13, a passivation layer 180 made of photosensitive organic material is coated and subjected to light exposure with a passivation pattern mask (not shown) and development to form a plurality of contact holes 182–185 exposing the end portions 179 of the data lines 171, the storage electrode lines 131, the storage electrodes 133a, and the drain electrodes 175.

Referring to FIGS. 1, 3 and 4, a transparent conductive layer made of ITO or IZO is sputtered and photo-etched with a pixel pattern mask (not shown) to form a plurality of pixel electrodes 190, a plurality of storage bridges 194, and a plurality of contact assistants 82 are formed on the passivation layer 180. The sputtering temperature of ITO or IZO is preferably lower than 250° C. for reducing contact resistance.

A TFT array panel for an LCD according to another embodiment of the present invention will be described in detail with reference to FIGS. 14 and 15.

Figure 14:
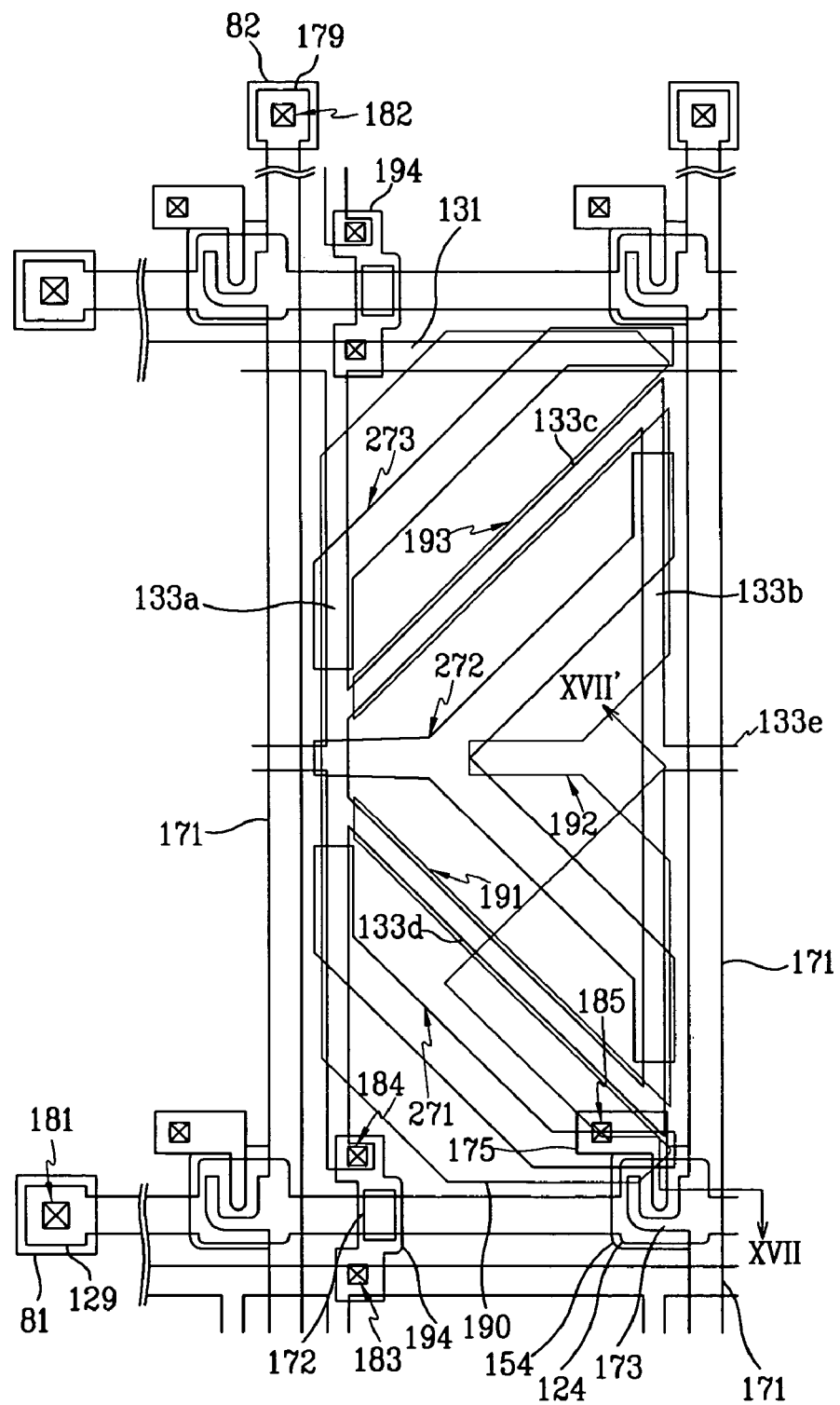
FIG. 14 is a layout view of a TFT array panel for an LCD according to another embodiment of the present invention.
Figure 15:
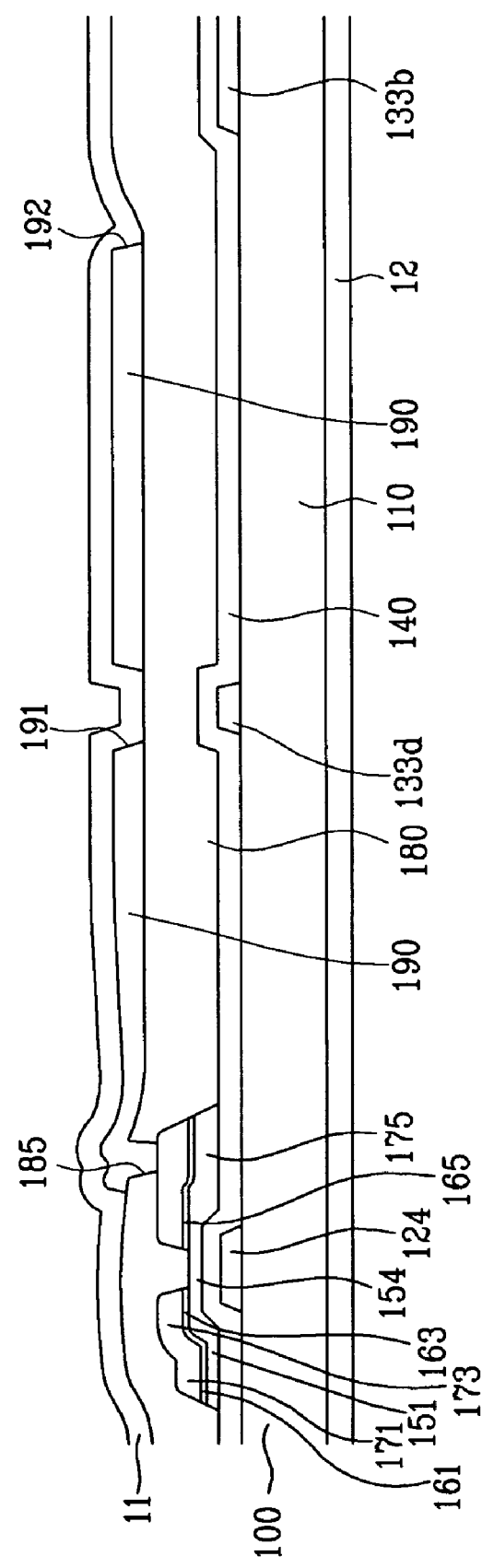
FIG. 15 is a sectional view of the TFT array panel shown in FIG. 14 taken along the line XV–XV'.

FIG. 14 is a layout view of a TFT array panel for an LCD according to another embodiment of the present invention, and FIG. 15 is a sectional view of the TFT array panel shown in FIG. 14 taken along the line XV–XV'.

Referring to FIGS. 14 and 15, a layered structure of the TFT array panel according to this embodiment is almost the same as that shown in FIGS. 1, 3 and 4.

That is, a plurality of gate lines 121 including a plurality of gate electrodes 124 and a plurality of storage electrode lines 131 including a plurality of storage electrodes 133a–133d and connections 133e are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of metal pieces 172 are formed on the ohmic contacts 161 and 165, and a passivation layer 180 are formed thereon. A plurality of contact holes 182 and 185 are provided at the passivation layer 180, and a plurality of pixel electrodes 190 and a plurality of contact assistants 82 are formed on the passivation layer 180.

Different from the TFT array panel shown in FIGS. 1, 3 and 4, the semiconductor stripes 151 of the TFT array panel according to this embodiment have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Furthermore, the TFT array panel further includes a plurality of semiconductor islands (not shown) and a plurality of ohmic contact islands (not shown) disposed thereon, which are disposed on the metal pieces 172.

Moreover, the gate lines 121 have expanded end portions 129. Accordingly, a plurality of contact holes 181 exposing the end portions 129 of the gate lines 121 are provided at the gate insulating layer 140 and the passivation layer 180, and a plurality of contact assistants 81 connected to the end portions 129 through the contact holes 181 are additionally provided.

A manufacturing method of the TFT array panel according to an embodiment simultaneously forms the data lines 171, the drain electrodes 175, the metal pieces 172, the semiconductors 151, and the ohmic contacts 161 and 165 using one photolithography process.

A photoresist pattern for the photolithography process has position-dependent thickness, and in particular, it has first and second portions with decreased thickness. The first portions are located on wire areas that will be occupied by the data lines 171, the drain electrodes 175, and the metal pieces 172 and the second portions are located on channel areas of TFTs.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

As a result, the manufacturing process is simplified by omitting a photolithography step.

Many of the above-described features of the TFT array panel for an LCD shown in FIGS. 1, 3 and 4 may be appropriate to the TFT array panel shown in FIGS. 14 and 15.

A TFT array panel for an LCD according to another embodiment of the present invention will be described in detail with reference to FIGS. 16 and 17.

Figure 16:
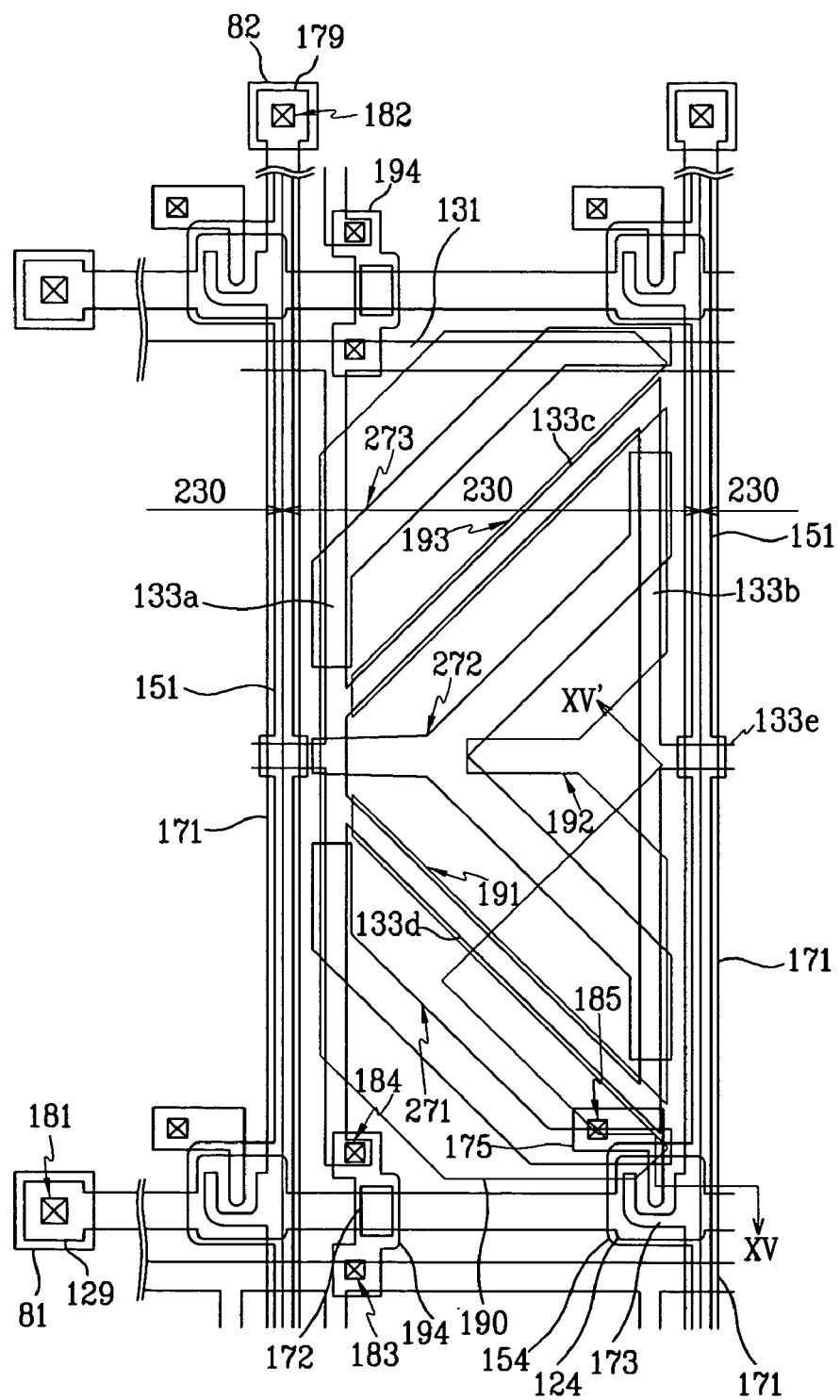
FIG. 16 is a layout view of a TFT array panel for an LCD according to another embodiment of the present invention.
Figure 17:
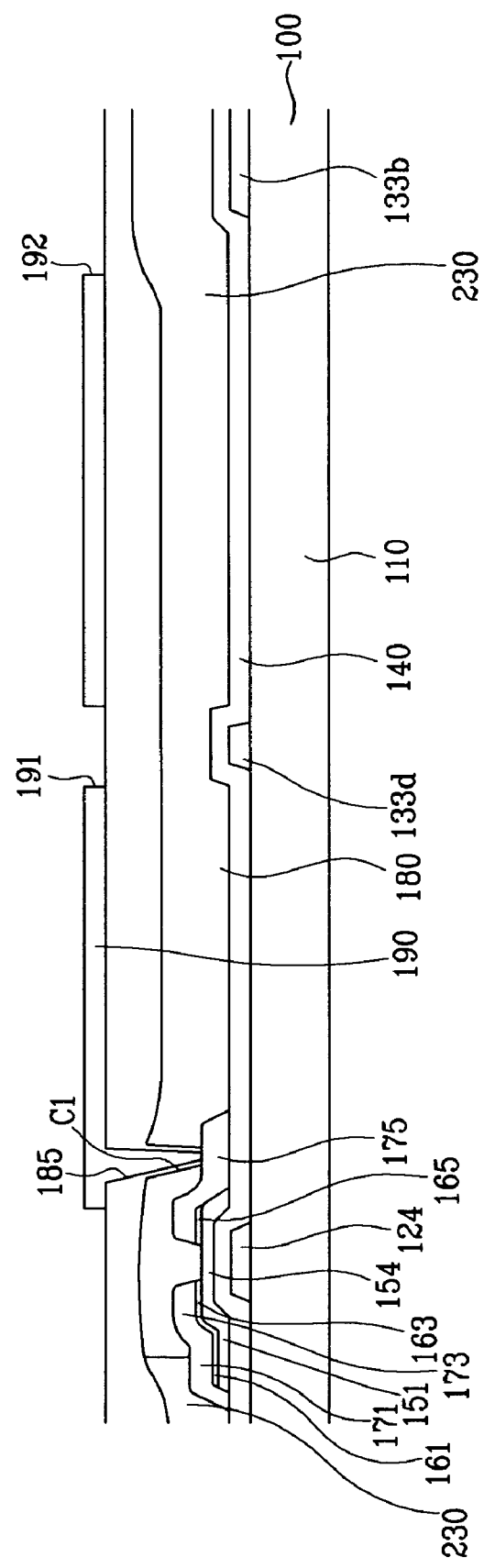
FIG. 17 is a sectional view of the TFT array panel shown in FIG. 16 taken along the line XVII–XVII'.

FIG. 16 is a layout view of a TFT array panel for an LCD according to another embodiment of the present invention, and FIG. 17 is a sectional view of the TFT array panel shown in FIG. 16 taken along the line XVII–XVII'.

Referring to FIGS. 16 and 17, a layered structure of the TFT array panel according to this embodiment is almost the same as those shown in FIGS. 1, 3 and 4.

That is, a plurality of gate lines 121 including a plurality of gate electrodes 124 and a plurality of storage electrode lines 131 including a plurality of storage electrodes 133a–133d and connections 133e are formed on a substrate 110, and a gate insulating layer 140, a plurality of semiconductor islands 154, and a plurality of ohmic contacts 163 and 165 are sequentially formed thereon. A plurality of data lines 171 including a plurality of source electrodes 173, a plurality of metal pieces 172, and a plurality of drain electrodes 175 are formed on the ohmic contacts 161 and 165 and the gate insulating layer 140, and a passivation layer 180 are formed thereon. A plurality of contact holes 182 and 185 are provided at the passivation layer 180, and a plurality of pixel electrodes 190 and a plurality of contact assistants 82 are formed on the passivation layer 180.

Different from the TFT array panel shown in FIGS. 1, 3 and 4, the TFT array panel according to this embodiment provides a plurality of red, green and blue color filters 230 are formed under the passivation layer 180.

The color filters 230 follow the shape of the pixel electrodes 190 and the color filters 230 in adjacent two data lines 171 and arranged in the longitudinal direction may be connected to each other to form a stripe. Edges of adjacent two of the color filters 230 exactly match with each other on the data lines 171, but the color filters 230 may overlap each other to block the light leakage between the pixel electrodes 190, or may be spaced apart from each other. When the color filters 230 overlap each other, a light blocking member dispose on a common electrode panel may be omitted. The color filters 230 have a plurality of openings C1 exposing the contact holes 185 and the contact holes 185 are preferably smaller than the openings C1 as shown in FIG. 17.

In addition, the gate lines 121 have expanded end portions 129. Accordingly, a plurality of contact holes 181 exposing the end portions 129 of the gate lines 121 are provided at the gate insulating layer 140 and the passivation layer 180, and a plurality of contact assistants 81 connected to the end portions 129 through the contact holes 181 are additionally provided. The color filters 230 are not provided on a peripheral area which is provided with the expansions 129 and 179 of the gate lines 121 and the data lines 179.

Many of the above-described features of the TFT array panel for an LCD shown in FIGS. 1, 3 and 4 may be appropriate to the TFT array panel shown in FIGS. 16 and 17.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel, comprising:
 a substrate;
 a first signal line formed on the substrate;
 a second signal line formed on the substrate and intersecting the first signal line;
 a thin film transistor, including a gate electrode connected to the first signal line and having an edge substantially parallel to the first signal line, a source electrode connected to the second signal line, and a drain electrode overlapping the edge of the gate electrode; and,
 a pixel electrode connected to the drain electrode,
 wherein the pixel electrode and the drain electrode are disposed in different layers on the substrate.

2. The thin film transistor array panel of claim 1, wherein the edge of the gate electrode is substantially perpendicular to the second signal line.

3. The thin film transistor array panel of claim 1, wherein the source electrode partly encloses a portion of the drain electrode.

4. The thin film transistor array panel of claim 3, wherein the source electrode has an edge that faces the drain electrode and has a shape of hook or horseshoe.

5. The thin film transistor array panel of claim 1, wherein the source electrode and the drain electrode have edges that face each other and are rectilinear.

6. The thin film transistor array panel of claim 1, wherein the pixel electrode has a cutout.

7. The thin film transistor array panel of claim 6, wherein the cutout makes an angle of about 45 degrees with the first signal line.

8. The thin film transistor array panel of claim 7, wherein the pixel electrode has a chamfered edge parallel to the cutout.

9. The thin film transistor array panel of claim 1, wherein the pixel electrode has a plurality of cutouts arranged symmettical with respect to a transverse line bisecting the pixel electrode.

10. The thin film transistor array panel of claim 9, further comprising a third signal line separated from the first and the second signal lines and overlapping the pixel electrode.

11. The thin film transistor array panel of claim 10, further comprising a storage electrode connected to the third signal line and overlapping the cutouts.

12. A method of manufacturing a thin film transistor array panel, the method comprising:
 forming a gate line on a substrate, the gate line including a gate electrode that has an edge;
 depositing a gate insulating layer;
 forming a semiconductor layer on the gate insulating layer;
 forming a drain electrode overlapping the edge of the gate electrode and a data line includling a source electrode that is disposed at least on the semiconductor layer;
 forming a passivation layer; and,
 forming a pixel electrode connected to the drain electrode, wherein the formation of the drain electrode and the data line includes photolithography that scans perpendicular to the edge of the gate electrode.

13. The method of claim 12, wherein the photolithography comprises divisional exposure.

14. The method of claim 13, wherein the formation of the semiconductor layer and the formation of the drain electrode and the data line include a single photolithography.

15. The method of claim 13, wherein the pixel electrode comprises ITO or IZO.

* * * * *